United States Patent
Wang et al.

(10) Patent No.: US 9,373,620 B2
(45) Date of Patent: Jun. 21, 2016

(54) SERIES CONNECTED TRANSISTOR STRUCTURE AND METHOD OF MANUFACTURING THE SAME

(71) Applicant: TAIWAN SEMICONDUCTOR MANUFACTURING CO., LTD., Hsinchu (TW)

(72) Inventors: Chin-Chi Wang, New Taipei (TW); Chien-Chih Lee, New Taipei (TW); Tien-Wei Chiang, Taipei (TW); Ching-Wei Tsai, Hsinchu (TW); Chih-Ching Wang, Jinhu Township (TW); Jon-Hsu Ho, New Taipei (TW); Wen-Hsing Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/485,541

(22) Filed: Sep. 12, 2014

(65) Prior Publication Data
US 2016/0079239 A1   Mar. 17, 2016

(51) Int. Cl.
| H01L 29/66 | (2006.01) |
| H01L 21/336 | (2006.01) |
| H01L 27/088 | (2006.01) |
| H01L 29/78 | (2006.01) |
| H01L 29/45 | (2006.01) |
| H01L 29/06 | (2006.01) |

(Continued)

(52) U.S. Cl.
CPC ............ *H01L 27/088* (2013.01); *H01L 21/283* (2013.01); *H01L 21/30604* (2013.01);
(Continued)

(58) Field of Classification Search
CPC .............. H01L 27/0688; H01L 27/101; H01L 45/1206; H01L 45/14; H01L 29/0653; H01L 27/088; H01L 21/283; H01L 21/30604; H01L 21/31; H01L 21/76897; H01L 23/528; H01L 29/0649; H01L 29/45; H01L 29/66666; H01L 29/7827
USPC .......... 257/192, 147, E27.012, 330, E21.411, 257/329, 288; 438/268, 270, 138, 238, 589, 438/283
See application file for complete search history.

(56) References Cited

U.S. PATENT DOCUMENTS

2004/0235300 A1 * 11/2004 Mathew et al. ............... 438/689
2006/0046391 A1 *  3/2006 Tang et al. ..................... 438/268
(Continued)

FOREIGN PATENT DOCUMENTS

| KR | 10-2004-0014841 A | 2/2004 |
| KR | 10-2006-0041415 A | 5/2006 |

(Continued)

OTHER PUBLICATIONS

Pending U.S. Appl. No. 14/334,719, filed Jul. 18, 2014.

*Primary Examiner* — Long K Tran
*Assistant Examiner* — Dzung Tran
(74) *Attorney, Agent, or Firm* — Maschoff Brennan

(57) ABSTRACT

A series-connected transistor structure includes a first source, a first channel-drain structure, a second channel-drain structure, a gate dielectric layer, a gate, a first drain pad and a second drain pad. The first source is over a substrate. The first channel-drain structure is over the first source and includes a first channel and a first drain thereover. The second channel-drain structure is over the first source and substantially parallel to the first channel-drain structure and includes a second channel and a second drain thereover. The gate dielectric layer surrounds the first channel and the second channel. The gate surrounds the gate dielectric layer. The first drain pad is over and in contact with the first drain. The second drain pad is over and in contact with the second drain, in which the first drain pad and the second drain pad are separated from each other.

17 Claims, 16 Drawing Sheets

(51) Int. Cl.
*H01L 23/528* (2006.01)
*H01L 21/283* (2006.01)
*H01L 21/306* (2006.01)
*H01L 21/768* (2006.01)
*H01L 21/31* (2006.01)

(52) U.S. Cl.
CPC .......... *H01L21/31* (2013.01); *H01L 21/76897* (2013.01); *H01L 23/528* (2013.01); *H01L 29/0649* (2013.01); *H01L 29/45* (2013.01); *H01L 29/66666* (2013.01); *H01L 29/7827* (2013.01)

(56) References Cited

U.S. PATENT DOCUMENTS

| | | |
|---|---|---|
| 2006/0097304 A1 | 5/2006 | Yoon et al. |
| 2008/0173936 A1 | 7/2008 | Yoon et al. |
| 2009/0251946 A1 | 10/2009 | Juengling |
| 2010/0207172 A1* | 8/2010 | Masuoka et al. ............ 257/255 |
| 2010/0270611 A1* | 10/2010 | Masuoka et al. ............ 257/329 |
| 2011/0012085 A1 | 1/2011 | Deligianni et al. |
| 2011/0303985 A1* | 12/2011 | Masuoka et al. ............ 257/369 |
| 2013/0153989 A1* | 6/2013 | Masuoka et al. ............ 257/329 |
| 2013/0203227 A1* | 8/2013 | Huo et al. .................... 438/238 |
| 2013/0273703 A1 | 10/2013 | Masuoka et al. |

FOREIGN PATENT DOCUMENTS

| | | |
|---|---|---|
| KR | 10-2008-0068544 A | 7/2008 |
| KR | 10-2011-0004415 A | 1/2011 |
| KR | 10-2013-0103694 A | 9/2013 |
| TW | 201434154 A | 9/2014 |

* cited by examiner

US 9,373,620 B2

SERIES CONNECTED TRANSISTOR STRUCTURE AND METHOD OF MANUFACTURING THE SAME

BACKGROUND

Semiconductor devices may be classified into I/O devices and core devices in accordance with functions thereof, in which both the I/O devices and core devices generally include horizontal transistors. Since higher voltage is applied to the I/O device compared to the core device, a length of a gate and a thickness of a gate dielectric layer of the horizontal transistor of the I/O device should be much greater than those of the core device, which results in great occupied area and poor integration density.

In order to improve integration density, vertical transistors with the same gate length in the I/O devices and the core devices may be applied. However, gate length and channel length of the vertical transistor are much less than that of the horizontal transistor, such that drain induced barrier lowering (DIBL) and hot carrier injection (HCI) phenomena may occur in the vertical transistor of the I/O device when high voltage is applied, and thus to increase leakage current and significantly reduce reliability. Accordingly, improvements in the vertical transistor of the I/O device continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
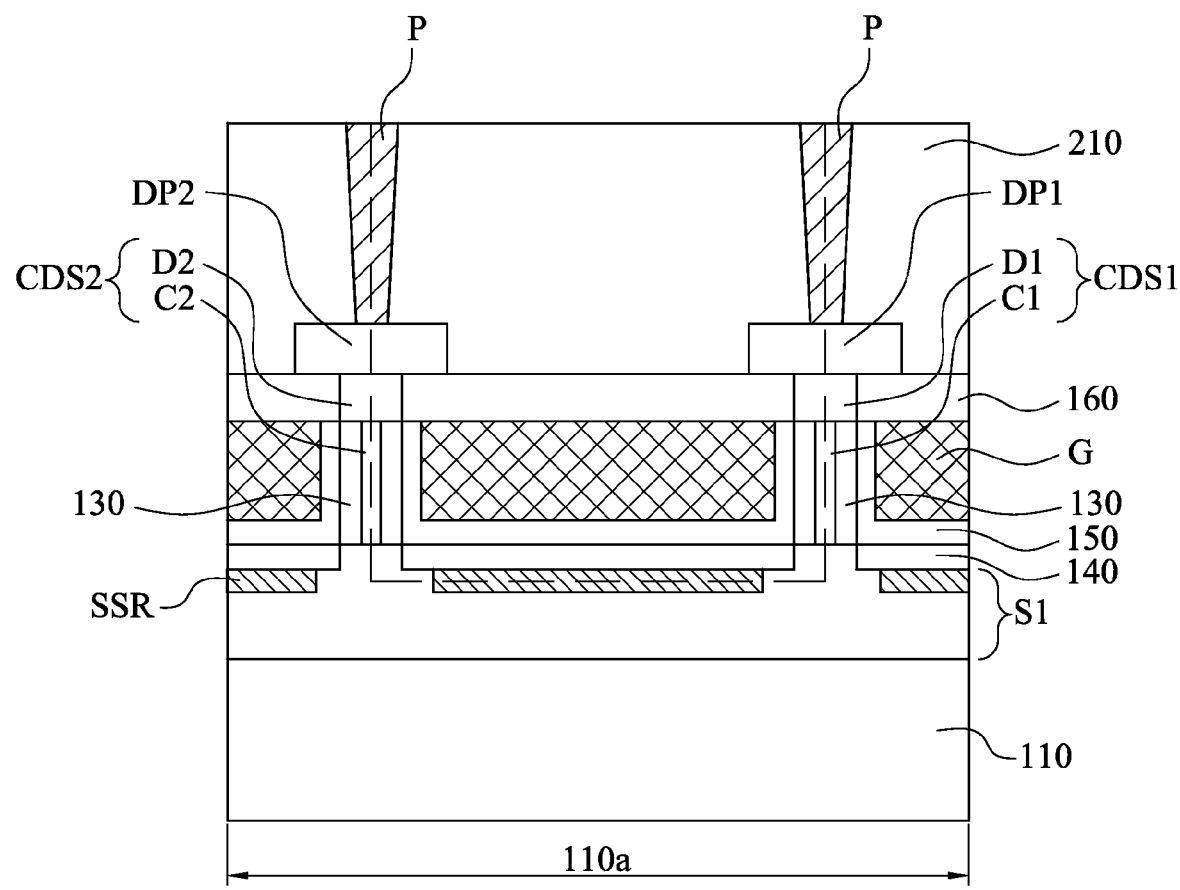
FIG. 1 is a cross-sectional view of a series-connected transistor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, when high voltage is applied to the vertical transistor, DIBL and HCI phenomena may occur and thus to increase leakage current and significantly reduce reliability. To address the above issue, a series-connected transistor structure for sharing voltage (e.g., drain-to-source voltage (Vds)) is provided to effectively reduce or prevent DIBL and HCI phenomena, and thus to decrease leakage current and improve reliability. Embodiments of the series-connected transistor structures and methods for manufacturing the same will be sequentially described below in detail.

FIG. 1 is a cross-sectional view of a series-connected transistor structure in accordance with some embodiments of the present disclosure. The series-connected transistor structure includes a first source S1, a first channel-drain structure CDS1, a second channel-drain structure CDS2, a gate dielectric layer 130, a gate G, a first drain pad DP1 and a second drain pad DP2. In some embodiments, the series-connected transistor structure is in an I/O device. In some embodiments, the series-connected transistor structure is in a core device.

The first source S1 is over a substrate 110. In some embodiments, the substrate 110 includes an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the substrate 110 includes a well region (not shown) of a conductivity type different from that of the first source S1 extending into the substrate 110 from an upper surface thereof. In some embodiments, the first source S1 is on and in contact with the well region. In some embodiments, the substrate 110 has an I/O region 110a and a core region (not shown), and the first source S1 is over the I/O region 110a of the substrate 110.

In some embodiments, the first source S1 is a heavily doped layer of a conductivity type. In some embodiments, the first source S1 is a heavily n-doped layer. In some embodiments that the first source S1 is the heavily n-doped layer, the well region is a p-type well region. In some embodiments, the first source S1 includes n-type dopants, such as phosphorus, arsenic, antimony, bismuth, selenium, tellurium, another suitable n-type dopants or a combination thereof. In some embodiments, the series-connected transistor structure further includes a source silicide region SSR in the first source S1 to reduce resistance thereof. In other words, the source silicide region SSR can be regarded as a portion of the first source S1. In some embodiments, the first source S1 includes a plurality of source silicide regions SSR spaced apart.

The first channel-drain structure CDS1 is over the first source S1. The first channel-drain structure CDS1 includes a first channel C1 and a first drain D1 over the first channel C1. In some embodiments, the first channel C1 is a doped layer of the same conductivity type as the first source S1. In some embodiments, the first drain D1 is a heavily doped layer of the same conductivity type as the first source S1.

The second channel-drain structure CDS2 is also over the first source S1 and substantially parallel to the first channel-drain structure CDS1. The second channel-drain structure CDS2 includes a second channel C2 and a second drain D2 over the second channel C2. In some embodiments, the second channel C2 is a doped layer of the same conductivity type as the first source S1. In some embodiments, the second drain D2 is a heavily doped layer of the same conductivity type as the first source S1. In some embodiments, the first channel-drain structure CDS1 and the second channel-drain structure CDS2 are vertical nanowire structures.

The gate dielectric layer 130 surrounds the first channel C1 and the second channel C2. In some embodiments, the gate dielectric layer 130 includes a dielectric material such as silicon dioxide, silicon nitride, silicon oxynitride or another suitable insulating material. The gate G surrounds the gate dielectric layer 130. In other words, the series-connected transistor structure belongs to a vertical gate-all-around (VGAA) transistor. In some embodiments, the gate G includes a conductive material such as polysilicon (poly), metal or metal alloy.

The first drain pad DP1 is over and in contact with the first drain D1, and the second drain pad DP2 is over and in contact with the second drain D2. The first drain pad DP1 and the second drain pad DP2 are separated from each other. In some embodiments, the first drain pad DP1 and the second drain pad DP2 include metal, silicide or other conductive materials. When high voltage is applied to the first drain pad DP1 or the second drain pad DP2, it will be shared to the first channel-drain structure CDS1 and the second channel-drain structure CDS2 through the first source S1, as shown in dotted lines of FIG. 1. In some embodiments, the series-connected transistor structure includes a plurality of the first channel-drain structures CDS1 and a plurality of the second channel-drain structures CDS2, and the first drain pad DP1 is over and in contact with the first drains D1, and the second drain pad DP2 is over and in contact with the second drains D2. When high voltage is applied to the first drain pad DP1 or the second drain pad DP2, it will be shared to the first channel-drain structures CDS1 and the second channel-drain structures CDS2 through the first source S1. In some embodiments, the first channel-drain structures CDS1 and the second channel-drain structures CDS2 are vertical nanowire structures.

In some embodiments, the series-connected transistor structure further includes a source dielectric layer 140 between the first source S1 and the gate G to electrically isolate the first source S1 from the gate G. In some embodiments, the source dielectric layer 140 includes a dielectric material such as silicon dioxide, silicon nitride, silicon oxynitride or another suitable insulating material.

In some embodiments, the series-connected transistor structure further includes a high-k dielectric layer 150 between the gate dielectric layer 130 and the gate G and between the source dielectric layer 140 and the gate G. In some embodiments, the high-k dielectric layer 150 includes $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

In some embodiments, the series-connected transistor structure further includes an inter-layer dielectric (ILD) 160 covering the gate G and exposing an upper surface of the first drain D1 and an upper surface of the second drain D2. The first drain pad DP1 and the second drain pad DP2 are over the ILD 160 and respectively in contact with the first drain D1 and the second drain D2. In some embodiments, the series-connected transistor structure further includes another ILD 210 over the first drain pad DP1 and the second drain pad DP2. In some embodiments, the ILDs 160, 210 are made of silicon oxide, silicon oxynitride and/or other suitable insulating material. In some embodiments, the series-connected transistor structure further includes two conductive plugs P through the ILD 210 and respectively connected to the first drain pad DP1 and the second drain pad DP2. In some embodiments, the conductive plug P includes metal, metal compound or a combination thereof, such as Ti, Ta, W, Al, Cu, Mo, Pt, TiN, TaN, TaC, TaSiN, WN, MoN, MoON, $RuO_2$, TiAl, TiAlN, TaCN, combinations thereof or other suitable materials.

Figure 2:
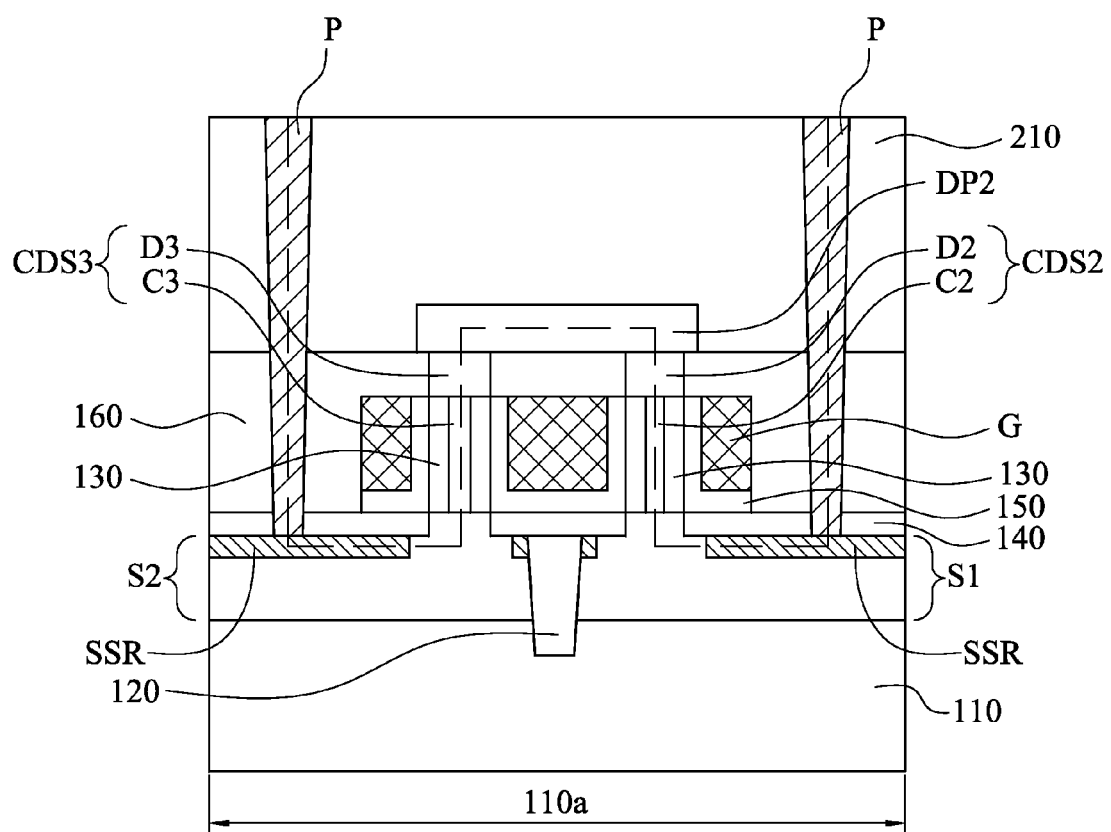
FIG. 2 is a cross-sectional view of a series-connected transistor structure in accordance with some embodiments of the present disclosure.

FIG. 2 is a cross-sectional view of a series-connected transistor structure in accordance with some embodiments of the present disclosure. The series-connected transistor structure includes a first source S1, a second source S2, an isolation portion 120, a second channel-drain structure CDS2, a third channel-drain structure CDS3, a gate dielectric layer 130, a gate G and a second drain pad DP2. In some embodiments, the series-connected transistor structure is in an I/O device. In some embodiments, the series-connected transistor structure is in a core device.

The first source S1 is over a substrate 110. The second source S2 is also over the substrate 110 and laterally adjacent to the first source S1. In some embodiments, the substrate 110 has an I/O region 110a and a core region (not shown), and the first source S1 and the second source S2 are over the I/O region 110a of the substrate 110. In some embodiments, the first source S1 and the second source S2 are heavily doped layers of the same conductivity type. In some embodiments, the first source S1 and the second source S2 are heavily n-doped layers. In some embodiments, the first source S1 and the second source S2 are made of a same layer. In some embodiments, the series-connected transistor structure further includes a plurality of source silicide regions SSR in the first source S1 and the second source S2.

The isolation portion 120 is between the first source S1 and the second source S2 to electrically isolate the first source S1 from the second source S2. In some embodiments, the isolation portion 120 is a shallow trench isolation (STI). In some embodiments, the isolation portion 120 includes silicon oxide, silicon nitride, silicon oxynitride, a low-k dielectric material, and/or a combination thereof.

The second channel-drain structure CDS2 is over the first source S1. The second channel-drain structure CDS2 includes a second channel C2 and a second drain D2 over the second channel C2. In some embodiments, the second channel C2 is a doped layer of the same conductivity type as the first source S1. In some embodiments, the second drain D2 is a heavily doped layer of the same conductivity type as the first source S1.

The third channel-drain structure CDS3 is over the second source S2 and substantially parallel to the second channel-drain structure CDS2. The third channel-drain structure CDS3 includes a third channel C3 and a third drain D3 over the third channel C3. In some embodiments, the third channel C3 is a doped layer of the same conductivity type as the second source S2. In some embodiments, the third drain D3 is a heavily doped layer of the same conductivity type as the second source S2. In some embodiments, the second channel-drain structure CDS2 and the third channel-drain structure CDS3 are vertical nanowire structures.

The gate dielectric layer 130 surrounds the second channel C2 and the third channel C3. In some embodiments, the gate dielectric layer 130 includes a dielectric material such as silicon dioxide, silicon nitride, silicon oxynitride or another suitable insulating material. The gate G surrounds the gate dielectric layer 130. In some embodiments, the gate G includes a conductive material such as polysilicon (poly), metal or metal alloy.

The second drain pad DP2 is over and in contact with the second drain D2 and the third drain D3. In some embodiments, the second drain pad DP2 includes metal, silicide, or other conductive materials. Silicide may be cobalt silicide, titanium silicide, tungsten silicide, nickel silicide or a combination thereof. When high voltage is applied to the first source S1 or the second source S2, it will be shared to the second channel-drain structure CDS2 and the third channel-drain structure CDS3 through the second drain pad DP2, as shown in dotted lines of FIG. 2. In some embodiments, the series-connected transistor structure includes a plurality of the second channel-drain structures CDS2 over the first source S1 and a plurality of the third channel-drain structures CDS3 over the second source S2, and the second drain pad DP2 is over and in contact with the second drains D2 and the third drains D3. When high voltage is applied to the first source S1 or the second source S2, it will be shared to the second channel-drain structures CDS2 and the third channel-drain structures CDS3 through the second drain pad DP2. In some embodiments, the second channel-drain structures CDS2 and the third channel-drain structures CDS3 are vertical nanowire structures.

In some embodiments, the series-connected transistor structure further includes a source dielectric layer 140 between the first source S1 and the gate G and between the second source S2 and the gate G. In some embodiments, the source dielectric layer 140 includes a dielectric material such as silicon dioxide, silicon nitride, silicon oxynitride or another suitable insulating material.

In some embodiments, the series-connected transistor structure further includes a high-k dielectric layer 150 between the gate dielectric layer 130 and the gate G and between the source dielectric layer 140 and the gate G. In some embodiments, the high-k dielectric layer 150 includes $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

In some embodiments, the series-connected transistor structure further includes an ILD 160 covering the gate G and exposing an upper surface of the second drain D2 and an upper surface of the third drain D3. The second drain pad DP2 is over the ILD 160 and in contact with the second drain D2 and the third drain D3. In some embodiments, the series-connected transistor structure further includes another ILD 210 over the second drain pad DP2. In some embodiments, the ILDs 160, 210 are made of silicon oxide, silicon oxynitride and/or other suitable insulating material. In some embodiments, the series-connected transistor structure further includes two conductive plugs P through the ILDs 210, 160 and respectively connected to the first source S1 and the second source S2. In some embodiments, the conductive plug P includes metal, metal compound or a combination thereof.

Figure 3:
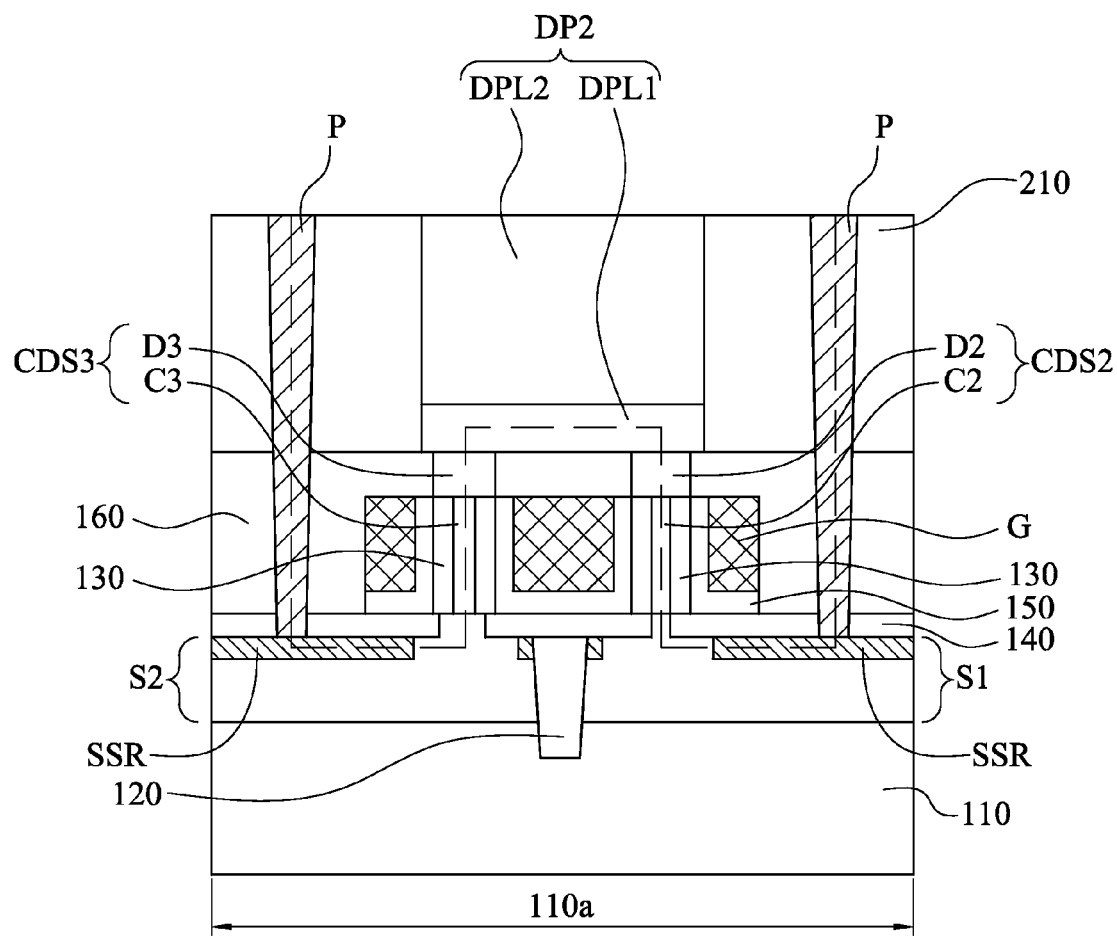
FIG. 3 is a cross-sectional view of a series-connected transistor structure in accordance with some embodiments of the present disclosure.

FIG. 3 is a cross-sectional view of a series-connected transistor structure in accordance with some embodiments of the present disclosure. The difference between the series-connected transistor structures of FIG. 2 and FIG. 3 is that the second drain pad DP2 of FIG. 3 includes a first drain pad layer DPL1 and a second drain pad layer DPL2. The first drain pad layer DPL1 is over and in contact with the second drain D2 and the third drain D3 and includes silicide. The second drain pad layer DPL2 is over the first drain pad layer DPL1 and includes metal, metal compound or a combination thereof to further reduce resistance of the second drain pad DP2. The metal or metal compound may be Ti, Ta, W, Al, Cu, Mo, Pt, TiN, TaN, TaC, TaSiN, WN, MoN, MoON, $RuO_2$, TiAl, TiAlN, TaCN, combinations thereof or other suitable materials. In some embodiments, the conductive plug P and the second drain pad layer DPL2 are made of the same material.

Figure 4:
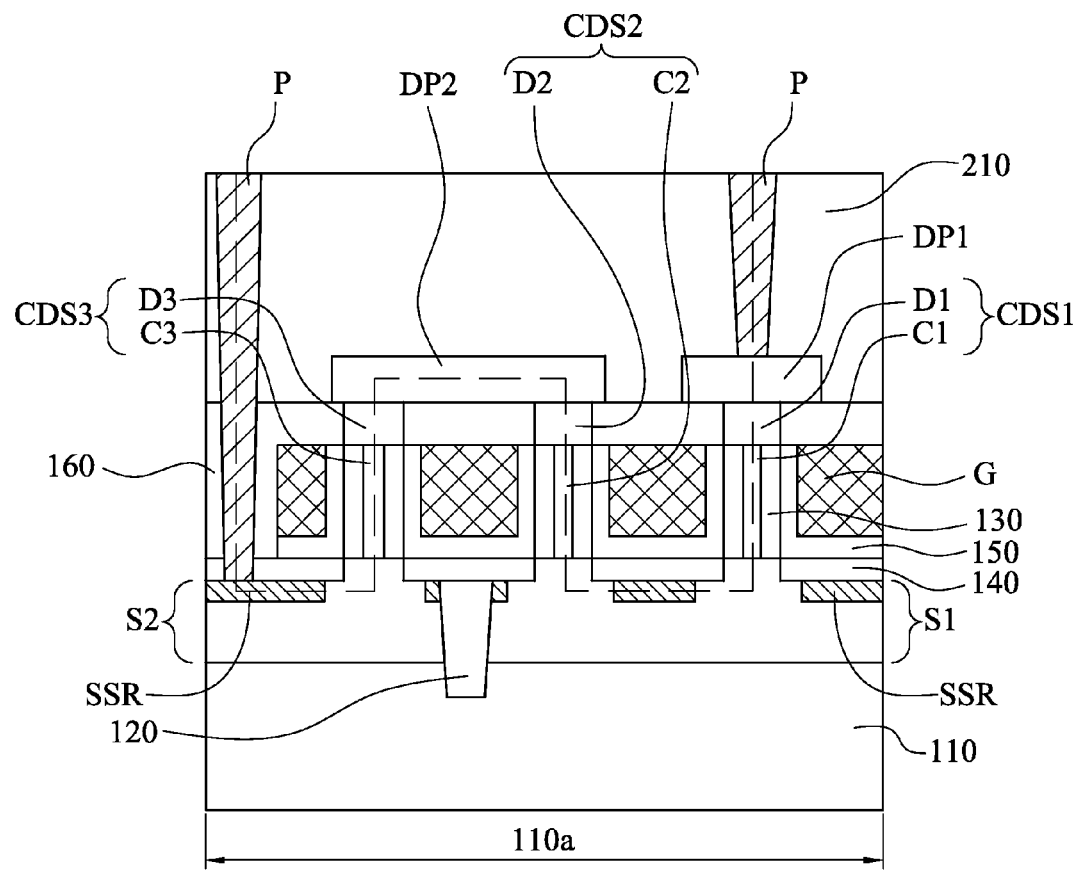
FIG. 4 is a cross-sectional view of a series-connected transistor structure in accordance with some embodiments of the present disclosure.

FIG. 4 is a cross-sectional view of a series-connected transistor structure in accordance with some embodiments of the present disclosure. The difference between the series-connected transistor structures of FIG. 4 and FIG. 2 is that the series-connected transistor structure of FIG. 4 further includes a first channel-drain structure CDS1 and a first drain pad DP1, and two conductive plugs P are respectively connected to the first drain pad DP1 and the second source S2.

The first channel-drain structure CDS1 is over the first source S1 and substantially parallel to the second channel-drain structure CDS2. The first channel-drain structure CDS1 includes a first channel C1 and a first drain D1 over the first channel C1. The gate dielectric layer 130 further surrounds the first channel C1. The first drain pad DP1 is over and in contact with the first drain D1. The first drain pad DP1 and the second drain pad DP2 are separated from each other. When high voltage is applied to the first drain pad DP1 or the second source S2 through one of the conductive plugs P, it will be shared to the first channel-drain structure CDS1, the second channel-drain structure CDS2 and the third channel-drain structure CDS3 through the first source S1 and the second drain pad D2, as shown in dotted lines of FIG. 4. In other embodiments, the series-connected transistor further includes a fourth channel-drain structure (not shown) over the second source S2 to replace the conductive plug P connected to the second source S2.

Figure 5:
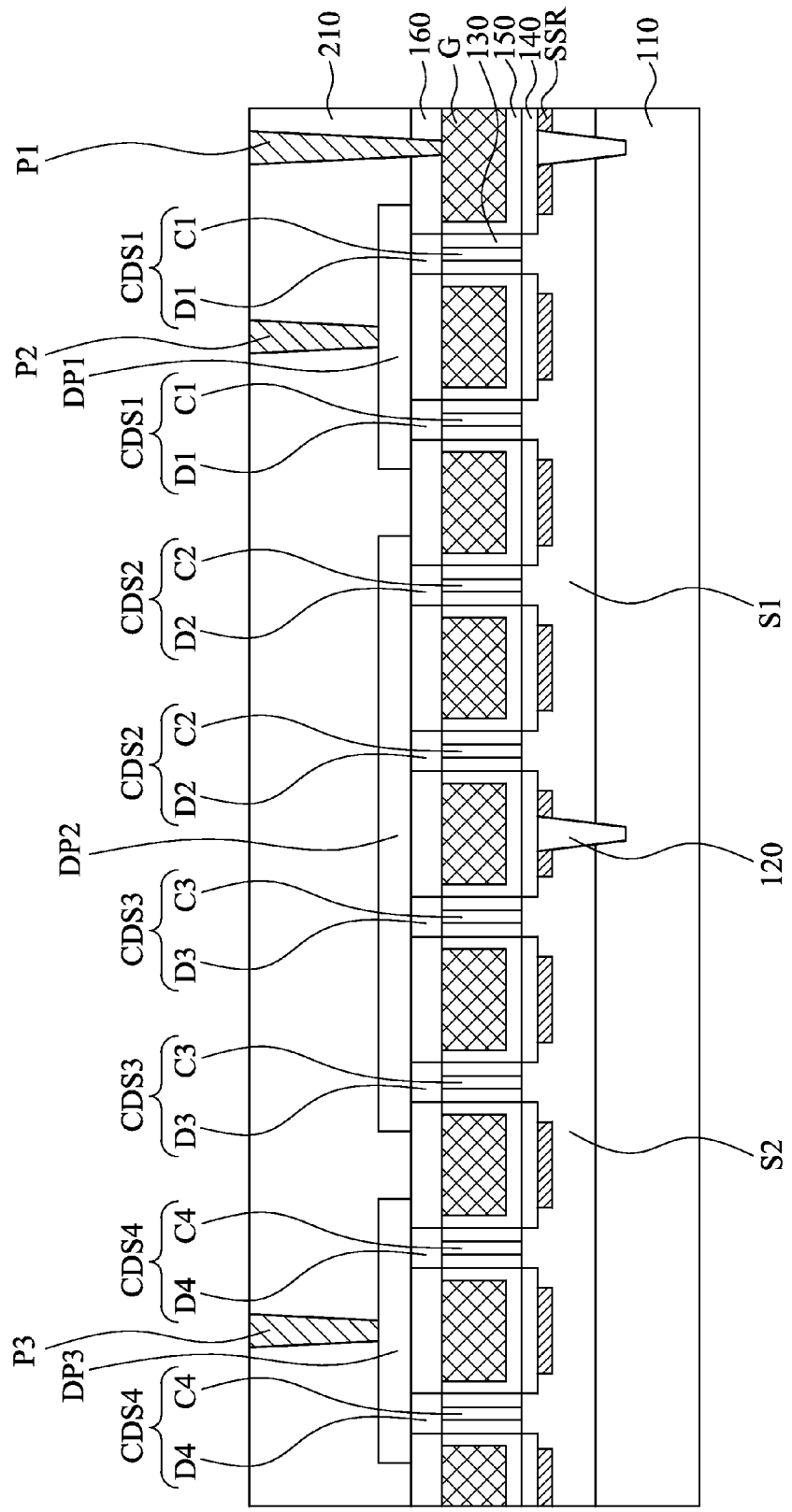
FIG. 5 is a cross-sectional view of a series-connected transistor structure in accordance with some embodiments of the present disclosure.

FIG. 5 is a cross-sectional view of a series-connected transistor structure in accordance with some embodiments of the present disclosure. The series-connected transistor structure includes a first source S1, a second source S2, an isolation portion 120, a plurality of first channel-drain structure CDS1, a plurality of second channel-drain structures CDS2, a plurality of third channel-drain structures CDS3, a plurality of fourth channel-drain structures CDS4, a gate dielectric layer 130, a gate G, a first drain pad DP1, a second drain pad DP2 and a third drain pad DP3. In some embodiments, the series-connected transistor structure further includes a first conductive plug P1, a second conductive plug P2 and a third conductive plug P3. The first conductive plug P1 is connected to the gate G. The second conductive plug P2 is connected to the first drain pad DP1. The third conductive plug P3 is connected to the third drain pad DP3. In some embodiments, Vg is applied on the gate G through the first conductive plug P1, and Vdd is applied on the first drain pad DP1 through the second conductive plug P2, and the third conductive plug P3 is electrically connected to a ground potential. The series-connected transistor structure can be used to provide high gain.

It is noteworthy that the series-connected transistor structure of the present disclosure may have a smaller occupied area than that of a series-connected FinFET structure since the series-connected transistor structure of the present disclosure can be considered as a vertical folding structure, and the series-connected FinFET structure is not a folding structure. In another point of view, in the case of the same occupied area, the series-connected transistor structure has higher gain than that of the typical series-connected FinFET structure.

In addition, it is found that the series-connected transistor structure has low local variation of Vth (i.e., threshold voltage) compared to a parallel-connected transistor structure. The difference between the series-connected transistor structure and the parallel-connected transistor structure is that for the parallel-connected transistor structure, there is only one drain pad connected to drains of channel-drain structures, and there is only one source connected to channels thereof.

As mentioned above, the series-connected transistor structure of the present disclosure can be used to share Vds by two or more channel-drain structures, one or more sources and one or more drain pads to effectively reduce or prevent DIBL and HCI phenomena. In addition, the series-connected transistor structure of the present disclosure occupies a small area compared to a horizontal transistor or a series-connected transistor structure connected through metal lines and conductive plugs, so as to have higher integration density.

Figure 6A:
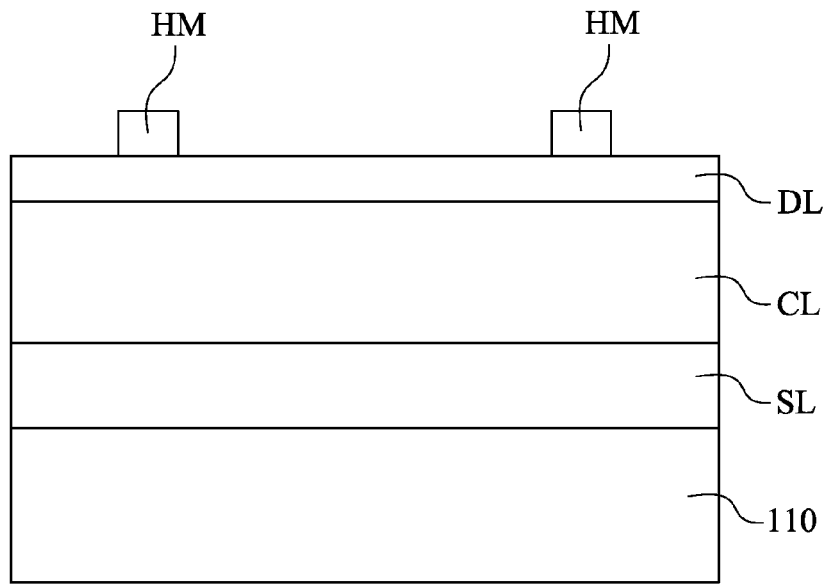
FIGS. 6A-6F are cross-sectional views at various stages of manufacturing a series-connected transistor structure in accordance with some embodiments of the present disclosure.

FIGS. 6A-6F are cross-sectional views at various stages of manufacturing a series-connected transistor structure in accordance with some embodiments of the present disclosure. As shown in FIG. 6A, a substrate 110 is provided. In some embodiments, the substrate 110 includes an elementary semiconductor, a compound semiconductor, an alloy semiconductor or combinations thereof. In some embodiments, a well implant process is performed to form a well region (not shown) of a conductivity type extending into the substrate 110 from an upper surface thereof.

A source layer SL, a channel layer CL and a drain layer DL are then sequentially formed over the substrate 110, as shown in FIG. 6A. In some embodiments, the source layer SL, the channel layer CL and the drain layer DL are sequentially formed by epitaxial (epi) growth and doping processes with different dopant concentrations. In some embodiments, the source layer SL, the channel layer CL and the drain layer DL are formed using ion implantation and annealing processes. A dopant concentration of the channel layer CL is lower than that of the source layer SL or the drain layer DL.

Subsequently, a hard mask layer HM is formed over the drain layer DL for patterning the drain layer DL, the channel layer CL and the source layer SL, as shown in FIG. 6A. In some embodiments, a hard mask material is formed using a chemical vapor deposition (CVD) process, a physical vapor deposition (PVD) process, spin-on coating, or another suitable formation process, and then patterned using a photolithography process or another suitable material removal process to form the hard mask layer HM.

Figure 6B:
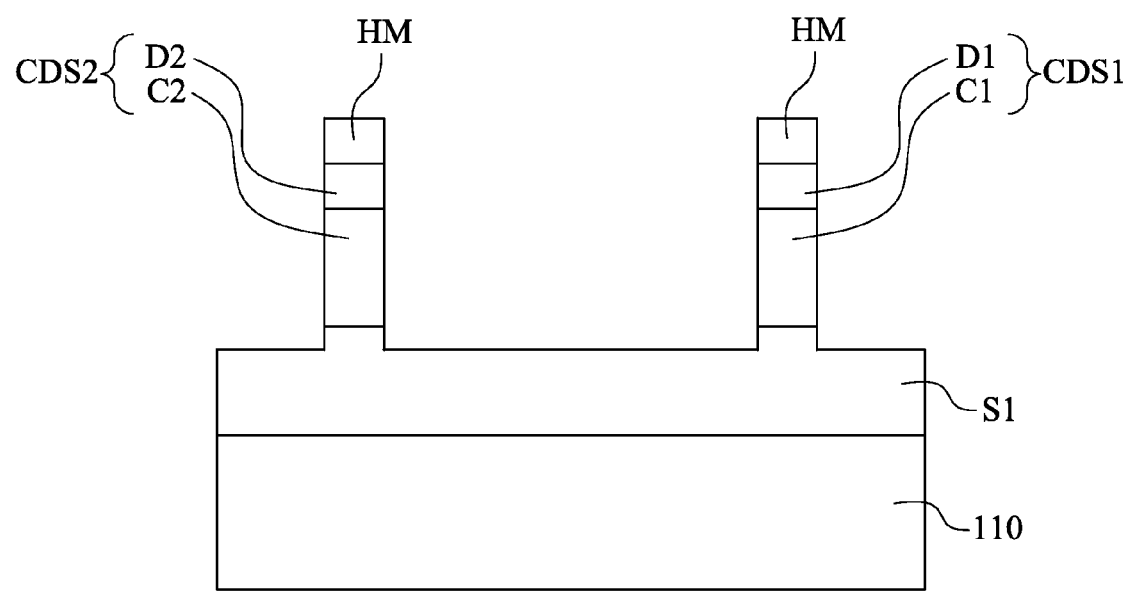

As shown in FIGS. 6A-6B, the drain layer DL, the channel layer CL and the source layer SL are patterned according to the hard mask layer HM to form a series-connected source-channel-drain structure protruding over the substrate 110, which includes a first source S1, a first channel-drain structure CDS1 and a second channel-drain structure CDS2. The first channel-drain structure CDS1 and a second channel-drain structure CDS2 are over the first source S1 and substantially parallel to each other. The first channel-drain structure CDS1 includes a first channel C1 and a first drain D1 over the first channel C1, and the second channel-drain structure CDS2 includes a second channel C2 and a second drain D2 over the second channel C2. In some embodiments, as shown in FIG. 6A, the drain layer DL exposed from the hard mask HM and the channel layer CL and the source layer SL thereneath are removed by a dry etching process. In some embodiments, the etchant includes carbon fluorides ($C_xF_y$), sulfur hexafluoride ($SF_6$), oxygen gas ($O_2$), helium (He), carbon chlorides ($C_xCl_y$), argon (Ar) or another suitable etchant material.

Figure 6C:
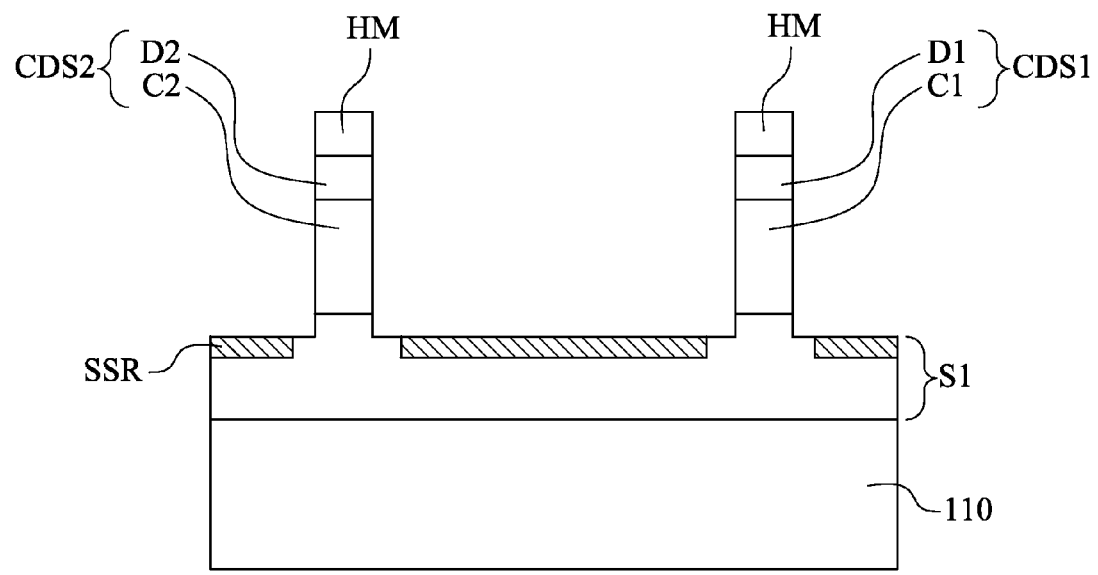

As shown in FIG. 6C, a plurality of source silicide regions SSR are formed in the first source S1. The source silicide regions SSR can be used to reduce resistance of the first source S1. In some embodiments, the source silicide regions SSR are formed by silicide deposition process. In some embodiments, the source silicide regions SSR are formed using metal deposition and annealing processes. In some embodiments, there is no source silicide region formed in the first source S1.

Figure 6D:
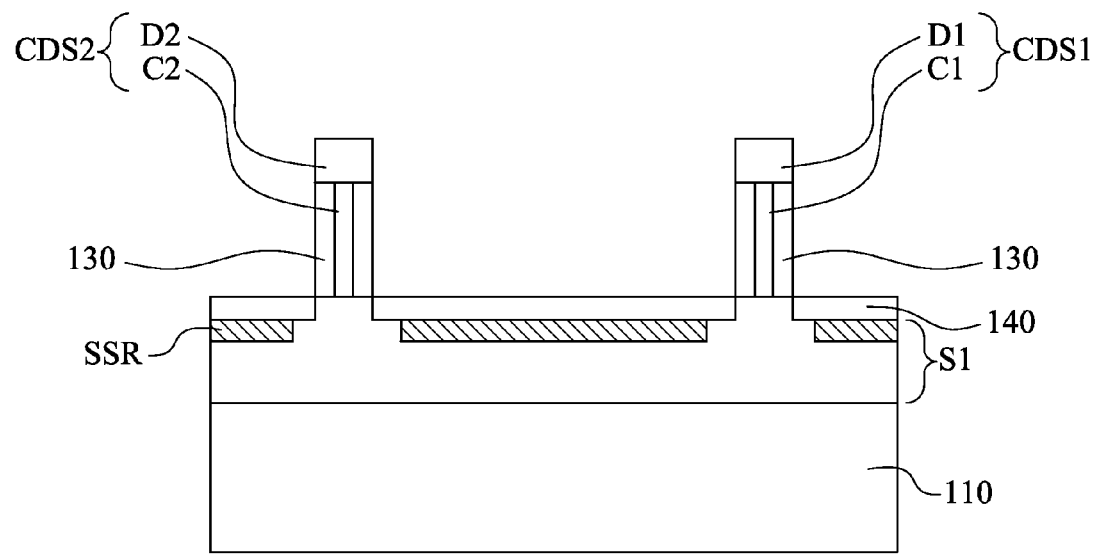

As shown in FIG. 6D, a source dielectric layer 140 is formed covering the first source S1 and the source silicide regions SSR. In some embodiments, the source dielectric layer 140 is formed using a CVD process, a PVD process, a spin-on coating process or another suitable formation process.

A gate dielectric layer 130 is then formed surrounding the first channel C1 and the second channel C2, as shown in FIG. 6D. In some embodiments, the gate dielectric layer 130 is formed using a PVD process, a CVD process, a thermal wet oxidation, a thermal dry oxidation, a thermal plasma oxidation or another formation process. In some embodiments, the gate dielectric layer 130 is formed using a thermal oxidation process. In some embodiments, a dielectric layer (not shown) is previously formed fully covering the first drain D1 and the second drain D2 to prevent oxidation during the thermal oxidation process for forming the gate dielectric layer 130.

Figure 6E:
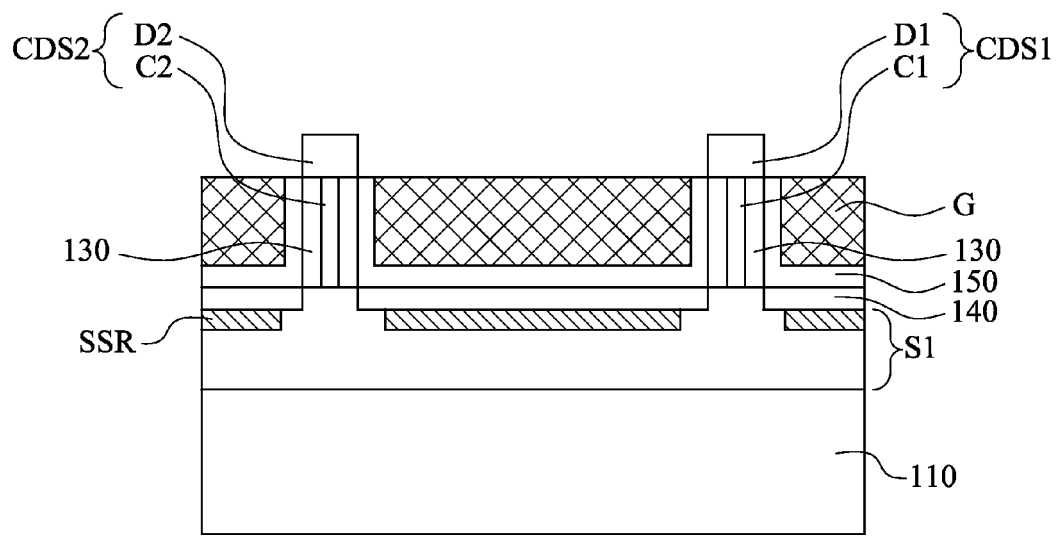

As shown in FIG. 6E, a high-k dielectric layer 150 and a gate G are formed over the source dielectric layer 140 and surrounding the gate dielectric layer 130. The source dielectric layer 140 is used to electrically isolate the first source S1 from the gate G. In some embodiments, a high-k dielectric material and a gate material are sequentially blanket deposited and then patterned to form the high-k dielectric layer 150 and the gate G. In some embodiments, the high-k dielectric material is blanket deposited using a CVD process, an ALD (atomic layer deposition) process or another suitable formation process. In some embodiments, the gate material is formed using a PVD process, a CVD process, an ALD process, a plating process, a spin-on coating process or another suitable formation process. In some embodiments, the gate material and the high-k dielectric material are patterned using a photolithography/etching process or another suitable material removal process.

Figure 6F:
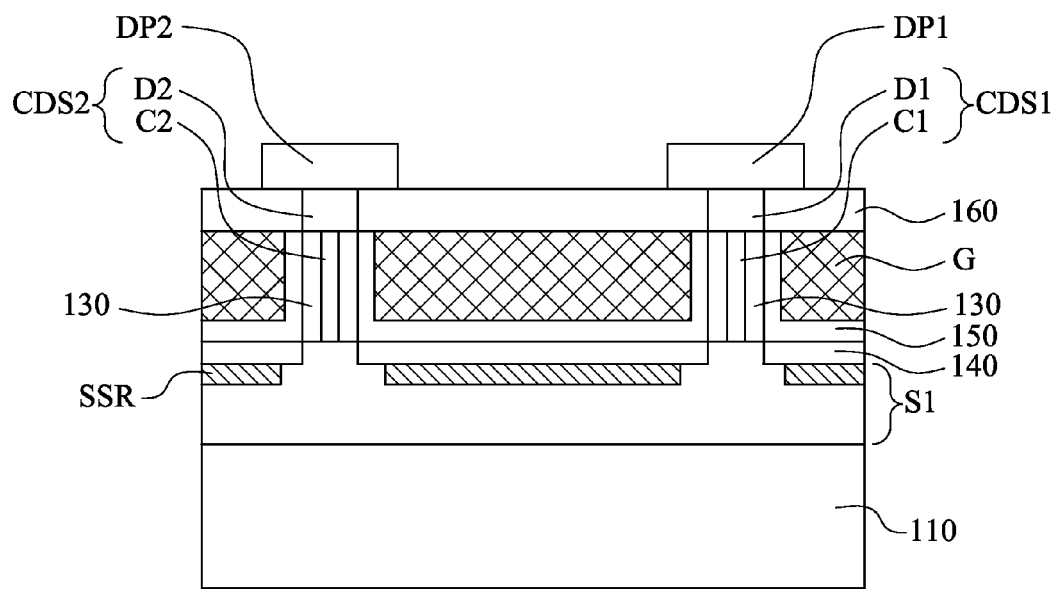

As shown in FIG. 6F, an ILD 160 is formed covering the first channel-drain structure CDS1, the second channel-drain structure CDS2 and the gate G, and a planarization process is then performed to expose an upper surface of the first drain D1 and an upper surface of the second drain D2. In some embodiments, the ILD 160 is formed using a CVD process, a PVD process, an ALD process, a spin-on process or another suitable formation process. In some embodiments, the planarization process includes a chemical mechanical polishing (CMP) process, a grinding process, an etching process or another suitable material removal process. In some embodiments, after the planarization process, an upper surface of the first drain D1 and an upper surface of the second drain D2 are coplanar with an upper surface of the ILD 160.

Subsequently, a first drain pad DP1 and a second drain pad DP2 are formed respectively over and in contact with the first drain D1 and the second drain D2, as shown in FIG. 6F. In some embodiments, a drain pad material is formed using any suitable formation process and then patterned using a photolithography/etching process or another suitable material removal process to form the first drain pad DP1 and the second drain pad DP2. In some embodiments, the first drain pad DP1 and the second drain pad DP2 include metal, silicide or a combination thereof.

After the formation of the first drain pad DP1 and the second drain pad DP2, another ILD 210 is formed over the first drain pad DP1, the second drain pad DP2 and the ILD 160, as shown in FIG. 1. In some embodiments, the ILD 210 is formed using a CVD process, a PVD process, an ALD process, a spin-on process or another suitable formation process.

Afterwards, the ILD 210 is patterned to form openings, and a conductive material is then filled in the openings to form conductive plugs P respectively connected to the first drain pad DP1 and the second drain pad DP2. In some embodiments, the ILD 210 is patterned using a photolithography/etching process, a laser drilling process or another suitable material removal process. In some embodiments, the conductive material is formed using a CVD process, a PVD process, an ALD process, a spin-on coating process or another formation process.

Figure 7A:
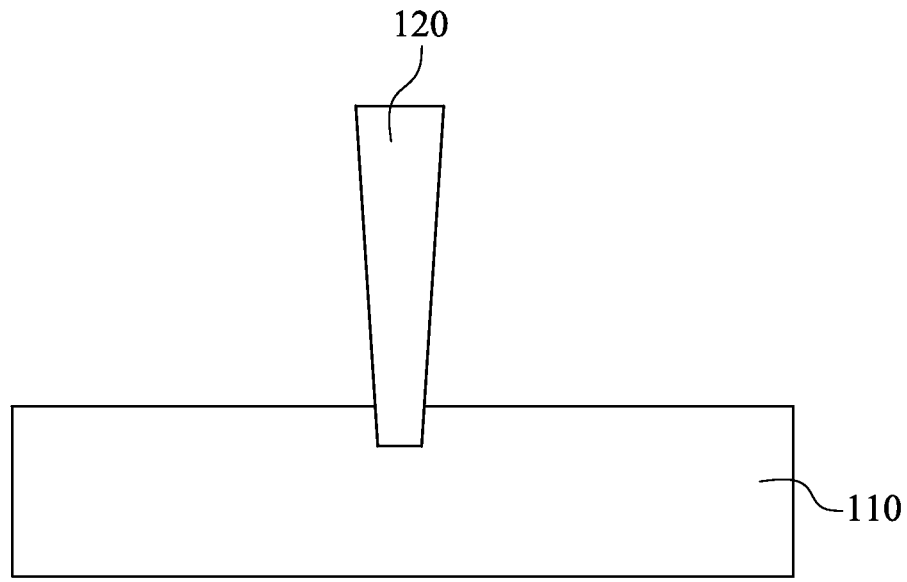
FIGS. 7A-7G are cross-sectional views at various stages of manufacturing a series-connected transistor structure in accordance with some embodiments of the present disclosure.

FIGS. 7A-7G are cross-sectional views at various stages of manufacturing a series-connected transistor structure in accordance with some embodiments of the present disclosure. As shown in FIG. 7A, a substrate 110 having an isolation portion 120 over the substrate 110 is provided. The isolation portion 120 is formed extending from inside the substrate 110 to outside the substrate 110. In some embodiments, a thick substrate (not shown) is provided, and the isolation portion 120 is formed therein. The thick substrate is then thinned to form the substrate 110 having the isolation portion 120. In some embodiments, before the thick substrate is thinned, a well implant process is performed to form a well region (not shown) of a conductivity type extending into the thick substrate from an upper surface thereof.

Figure 7B:
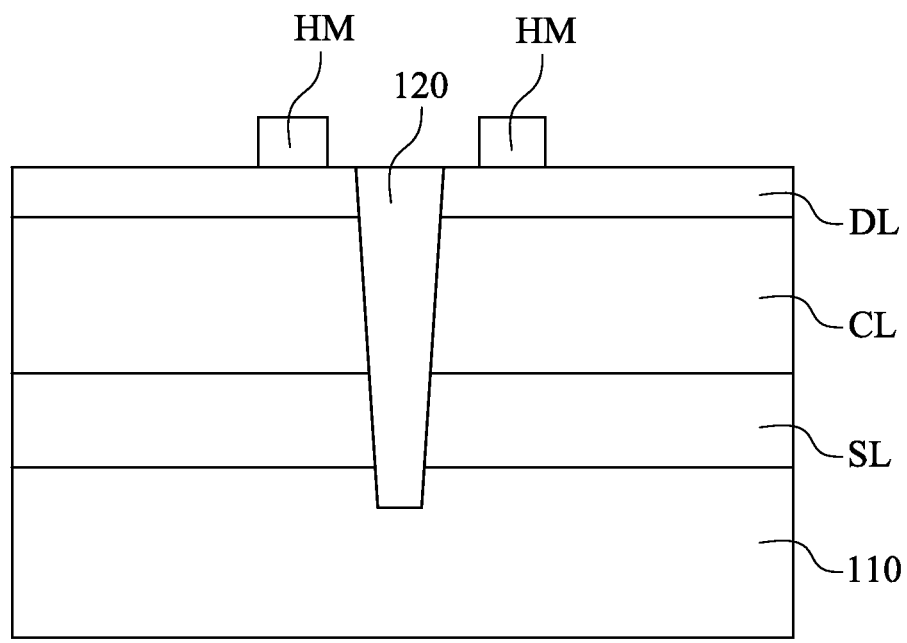

As shown in FIG. 7B, a source layer SL, a channel layer CL and a drain layer DL are then sequentially formed over the substrate 110 and adjacent to the isolation portion 120, as shown in FIG. 7B. In some embodiments, the source layer SL, the channel layer CL and the drain layer DL are sequentially formed by epi growth process and doping processes with different dopant concentrations. In some embodiments, the source layer SL, the channel layer CL and the drain layer DL are formed using ion implantation and annealing processes.

Subsequently, a hard mask layer HM is formed over the drain layer DL for patterning the source layer SL, the channel layer CL and the drain layer DL, as shown in FIG. 7B. In some embodiments, a hard mask material is formed using a CVD process, a PVD process, spin-on coating, or another suitable formation process, and then patterned using a photolithography process or another suitable material removal process to form the hard mask layer HM.

Figure 7C:
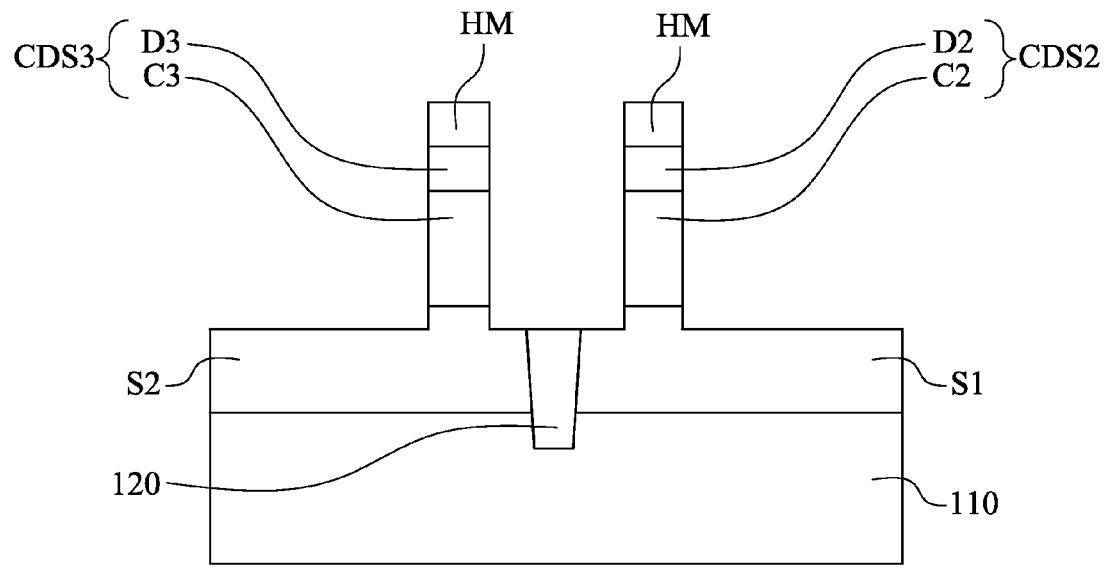

As shown in FIGS. 7B-7C, the drain layer DL, the channel layer CL and the source layer SL are patterned according to the hard mask layer HM to form a series-connected source-channel-drain structure protruding over the substrate 110, which includes a first source S1, a second source S2, a second channel-drain structure CDS2 over the first source S1 and a third channel-drain structure CDS3 over the second source S2. The isolation portion 120 is between the first source S1 and the second source S2. The second channel-drain structure CDS2 and the third channel-drain structure CDS3 are substantially parallel to each other. The second channel-drain structure CDS2 includes a second channel C2 and a second drain D2 over the second channel C2, and the third channel-drain structure CDS3 includes a third channel C3 and a third drain D3 over the third channel C3. In some embodiments, as shown in FIG. 7B, the drain layer DL exposed from the hard mask HM and the channel layer CL and the source layer SL therebeneath are removed by a dry etching process.

Figure 7D:
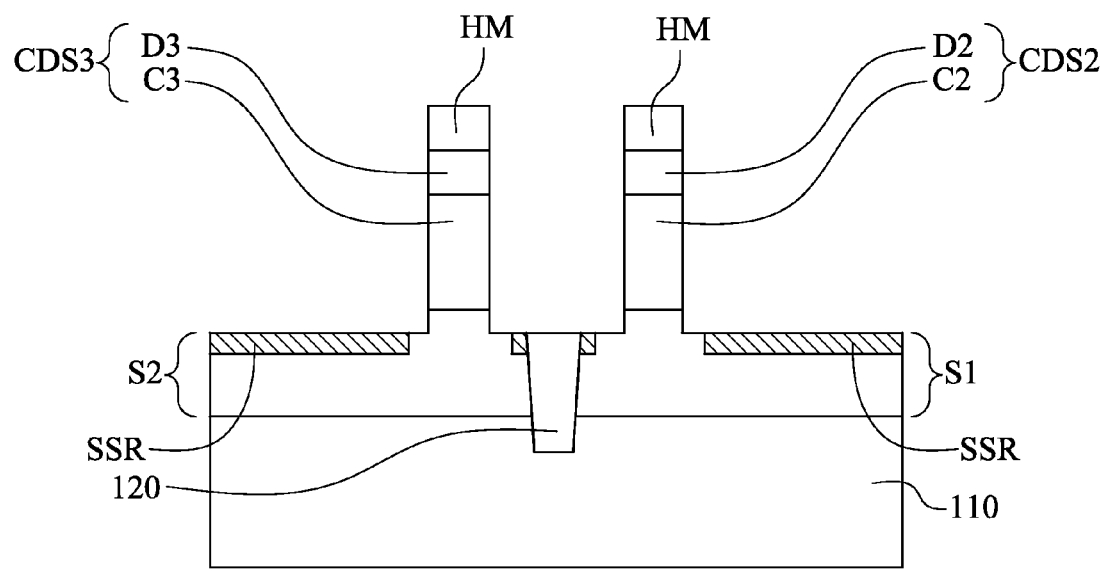

As shown in FIG. 7D, a plurality of source silicide regions SSR are formed in the first source S1 and the second source S2. The source silicide regions SSR can be used to reduce resistance of the first source S1 and that of the second source S2. In some embodiments, the source silicide regions SSR are formed by silicide deposition process. In some embodiments, the source silicide regions SSR are formed using metal deposition and annealing processes. In some embodiments, there is no source silicide region formed in the first source S1 and the second source S2.

Figure 7E:
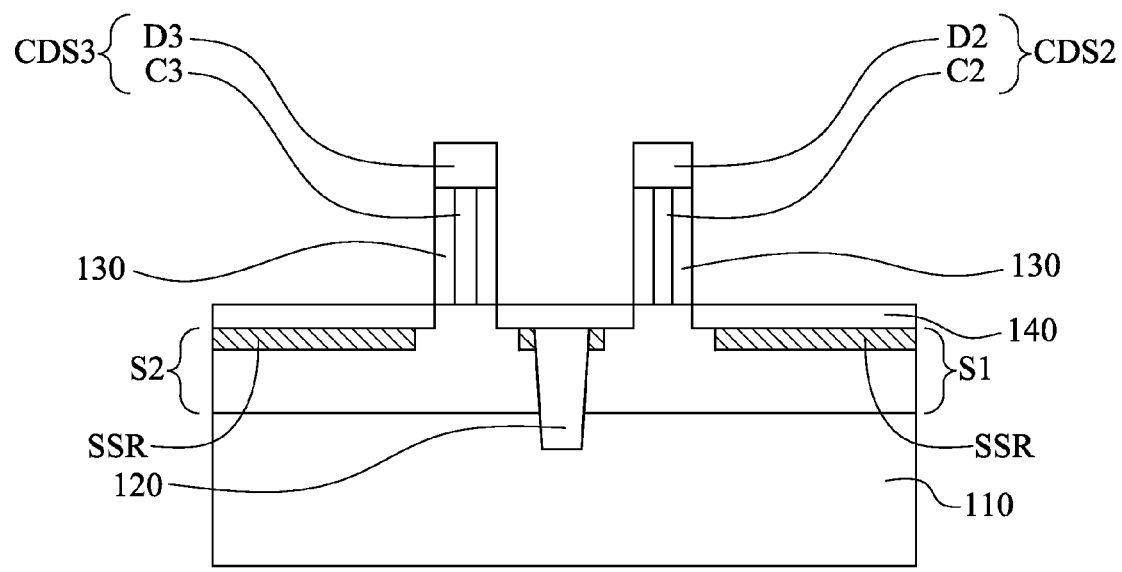

As shown in FIG. 7E, a source dielectric layer 140 is formed covering the first source S1, the second source S2, the source silicide regions SSR and the isolation portion 120. In some embodiments, the source dielectric layer 140 is formed using a CVD process, a PVD process, a spin-on coating process or another suitable formation process.

A gate dielectric layer 130 is then formed surrounding the second channel C2 and the third channel C3, as shown in FIG. 7E. In some embodiments, the gate dielectric layer 130 is formed using a PVD process, a CVD process, a thermal wet oxidation, a thermal dry oxidation, a thermal plasma oxidation or another formation process. In some embodiments, the gate dielectric layer 130 is formed using a thermal oxidation process. In some embodiments, a dielectric layer (not shown) is previously formed fully covering the second drain D2 and the third drain D3 to prevent oxidation during the thermal oxidation process for forming the gate dielectric layer 130.

Figure 7F:
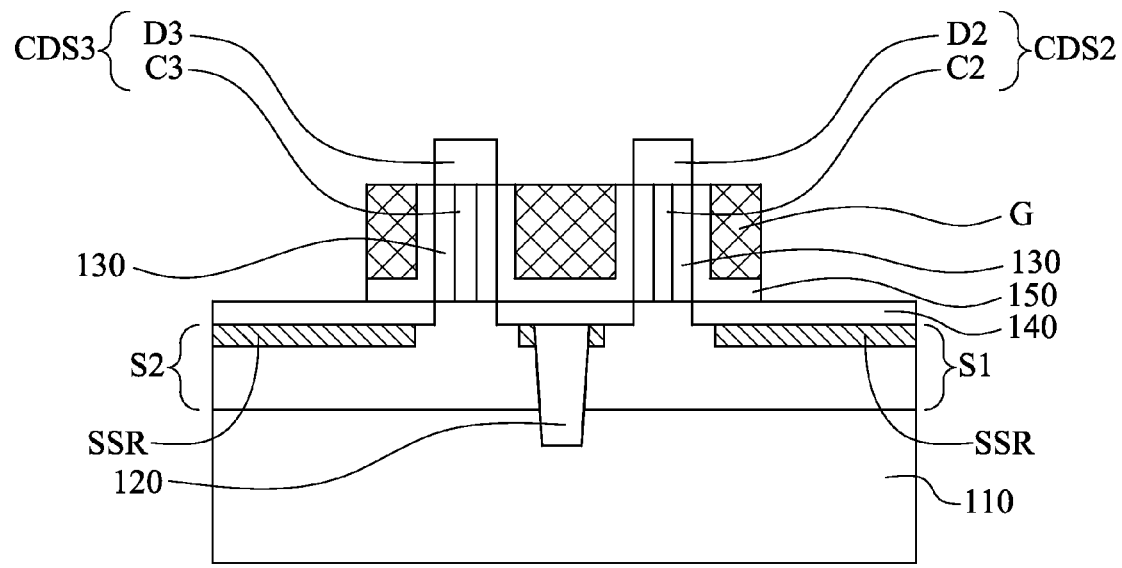

As shown in FIG. 7F, a high-k dielectric layer 150 and a gate G are formed over the source dielectric layer 140 and surrounding the gate dielectric layer 130. In some embodiments, a high-k dielectric material and a gate material are sequentially blanket deposited and then patterned using a photolithography/etching process to form the high-k dielectric layer 150 and the gate G.

Figure 7G:
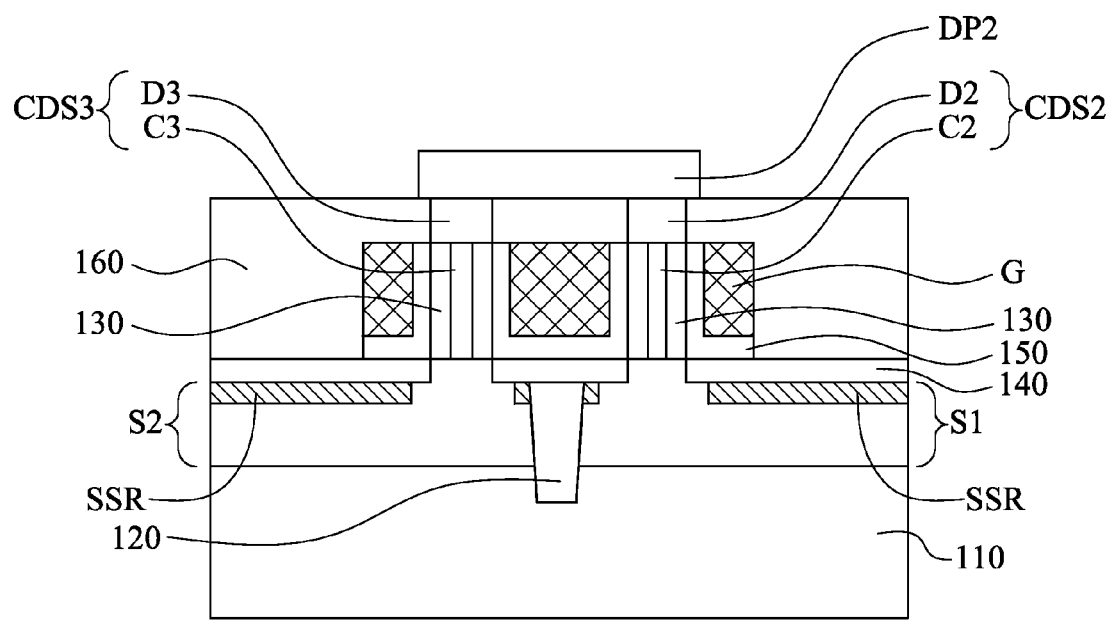

As shown in FIG. 7G, an ILD 160 is formed covering the second channel-drain structure CDS2, the third channel-drain structure CDS3 and the gate G, and a planarization process is then performed to expose an upper surface of the second drain D2 and an upper surface of the third drain D3. In some embodiments, the ILD 160 is formed using a CVD process, a PVD process, an ALD process, a spin-on process or another suitable formation process. In some embodiments, the planarization process includes a CMP process, a grinding process, an etching process or another suitable material removal process. In some embodiments, after the planarization process, an upper surface of the second drain D2 and an upper surface of the third drain D3 are coplanar with an upper surface of the ILD 160.

Subsequently, a second drain pad DP2 is formed over and in contact with the second drain D2 and the third drain D3, as shown in FIG. 7G. In some embodiments, a drain pad material is formed using any suitable formation process and then patterned using a photolithography/etching process or another suitable material removal process to form the second drain pad DP2. In some embodiments, the second drain pad DP2 includes metal, silicide or a combination thereof.

After the formation of the second drain pad DP2, another ILD 210 is formed over the second drain pad DP2 and the ILD 160, as shown in FIG. 2. In some embodiments, the ILD 210 is formed using a CVD process, a PVD process, an ALD process, a spin-on process or another suitable formation process.

Afterwards, the ILDs 210, 160 are patterned to form openings, and a conductive material is then filled in the openings to form conductive plugs P respectively connected to the first source S1 and the second source S2. In some embodiments, the ILDs 210, 160 are patterned using a photolithography/etching process, a laser drilling process or another suitable material removal process. In some embodiments, the conductive material is formed using a CVD process, a PVD process, an ALD process, a spin-on coating process or another formation process.

Figure 8A:
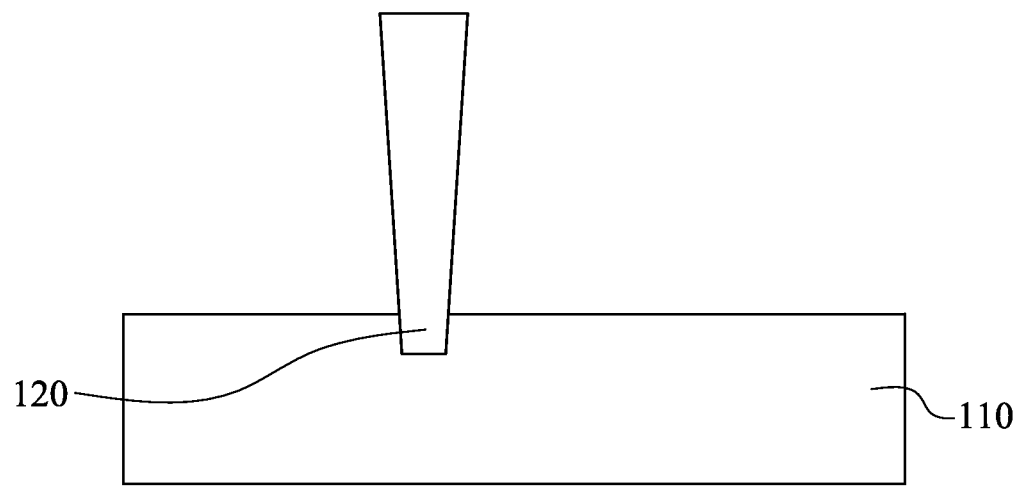
FIGS. 8A-8G are cross-sectional views at various stages of manufacturing a series-connected transistor structure in accordance with some embodiments of the present disclosure.
Figure 8B:
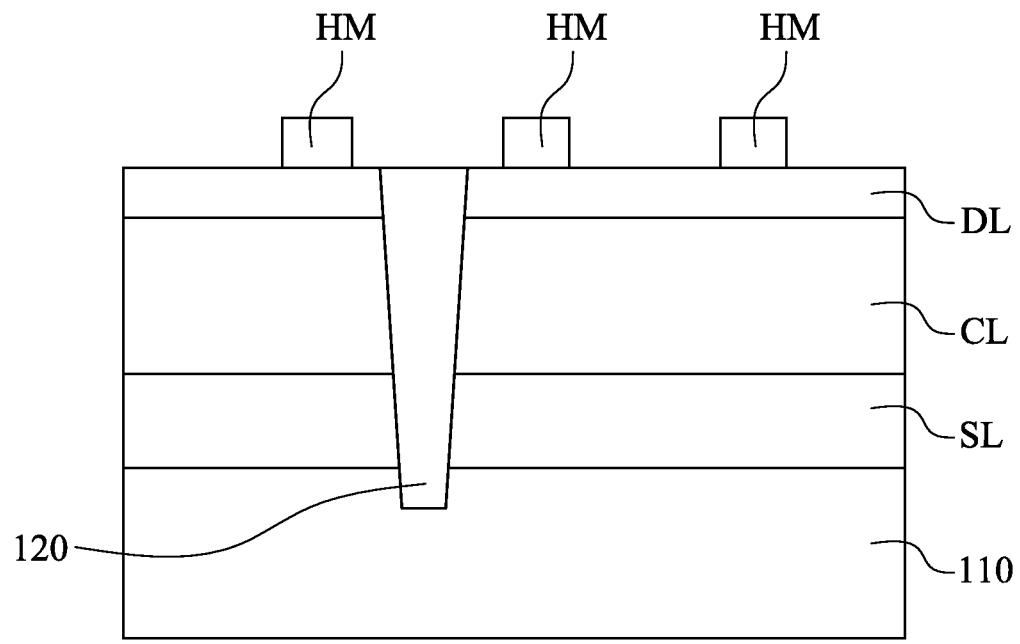

FIGS. 8A-8G are cross-sectional views at various stages of manufacturing a series-connected transistor structure in accordance with some embodiments of the present disclosure. As shown in FIG. 8A, a substrate 110 having an isolation portion 120 over the substrate 110 is provided. The isolation portion 120 is formed extending inside the substrate 110 to outside the substrate 110. As shown in FIGS. 8B, a source layer SL, a channel layer CL and a drain layer DL are then sequentially formed over the substrate 110 and adjacent to the isolation portion 120. Subsequently, a hard mask layer HM is formed over the drain layer DL for patterning the drain layer DL, the channel layer CL and the source layer SL.

Figure 8C:
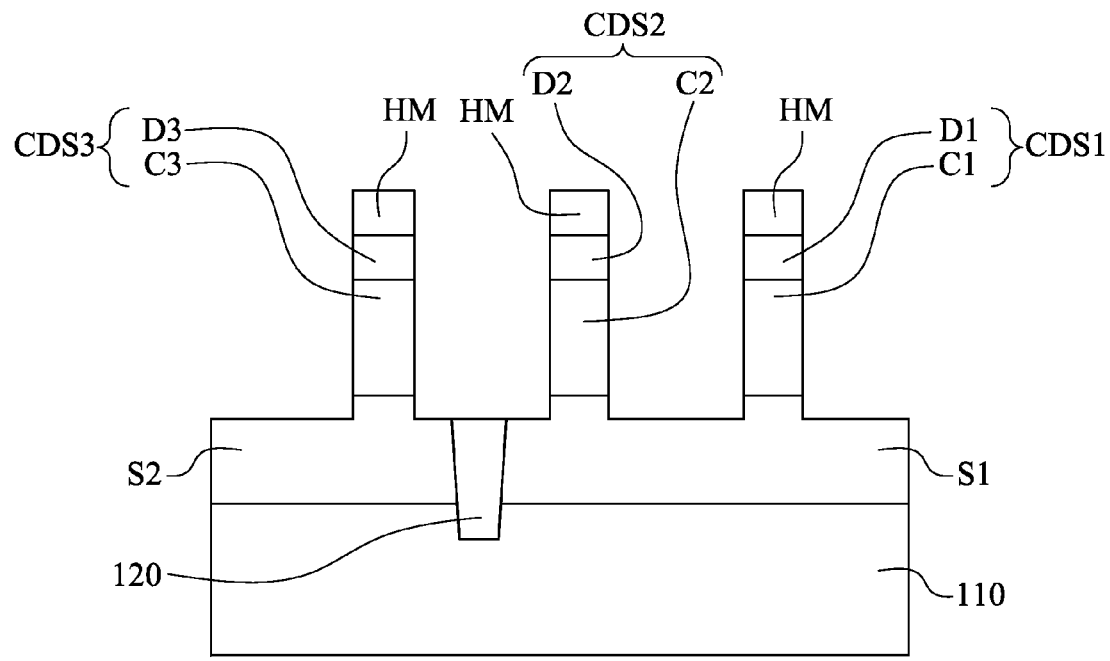

As shown in FIGS. 8B-8C, the drain layer DL, the channel layer CL and the source layer SL are patterned according to the hard mask layer HM to form a series-connected source-channel-drain structure protruding over the substrate 110, which includes a first source 51, a second source S2, a first channel-drain structure CDS1 and a second channel-drain structure CDS2 over the first source 51, and a third channel-drain structure CDS3 over the second source S2. That is, compared to the embodiments of FIGS. 7B-7C, the embodiments of FIGS. 8B-8C further include forming the first channel-drain structure CDS1 over the first source S1 and substantially parallel to the second channel-drain structure CDS2. The first channel-drain structure CDS1 includes a first channel C1 and a first drain D1 over the first channel C1.

Figure 8D:
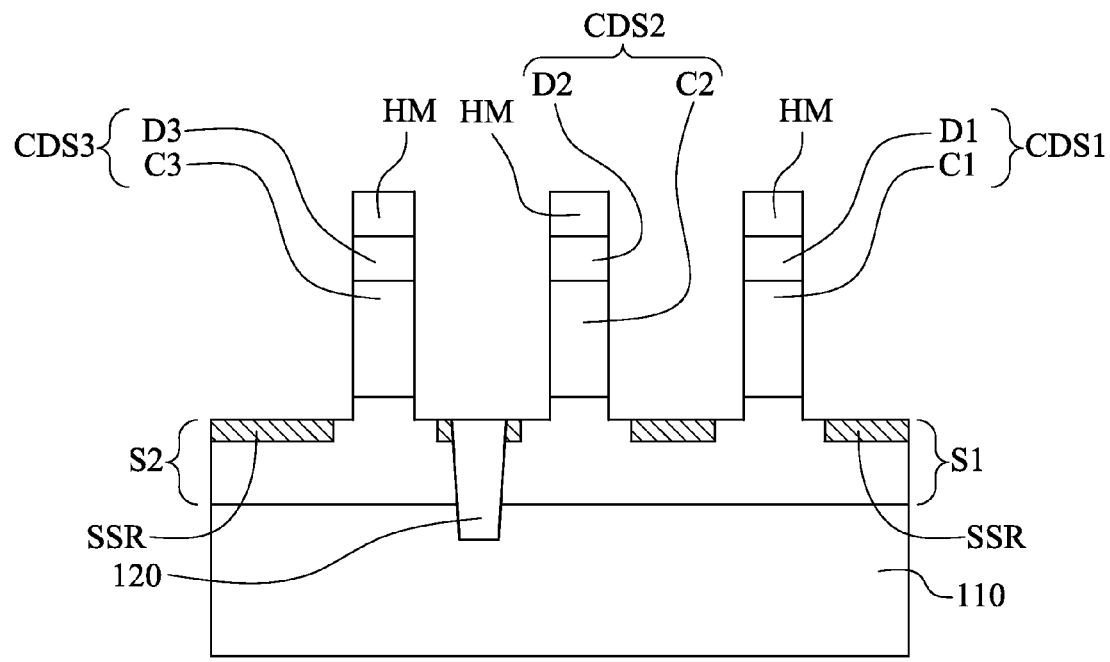
Figure 8E:
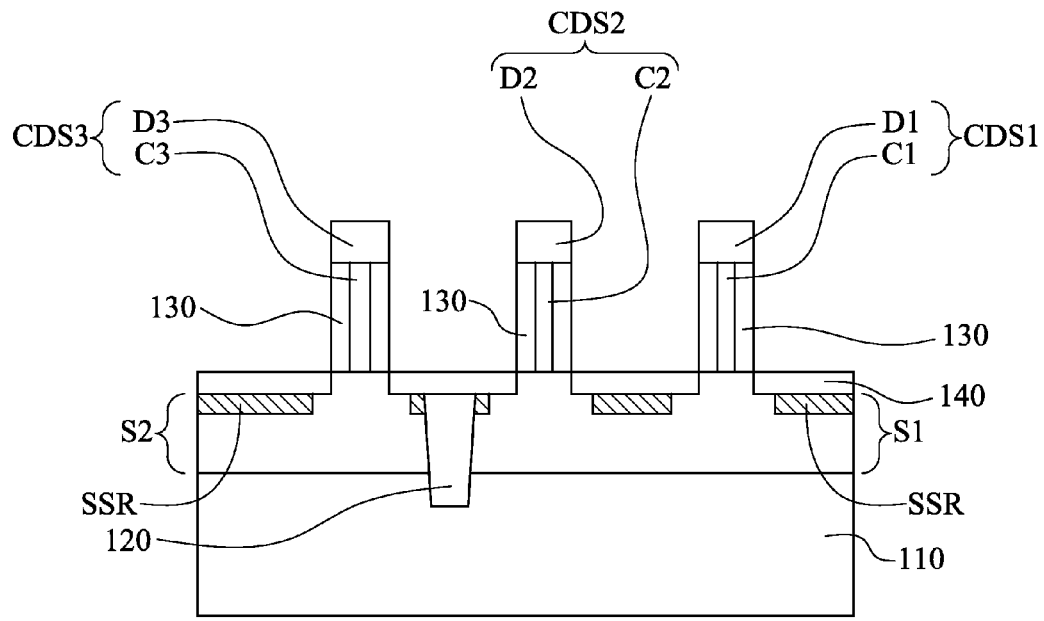
Figure 8F:
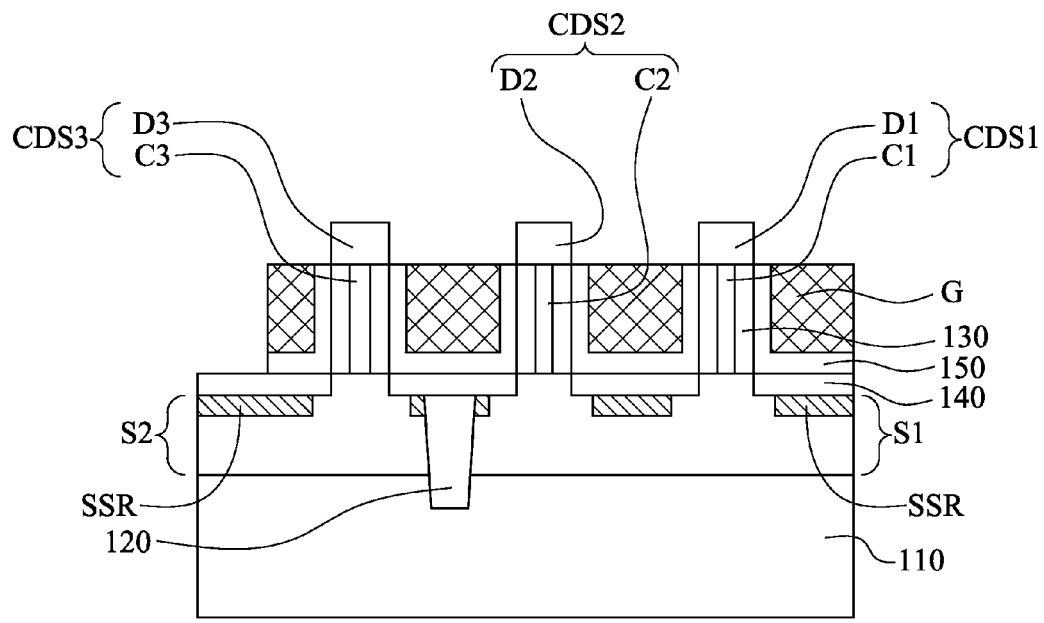

As shown in FIG. 8D, a plurality of source silicide regions SSR are formed in the first source S1 and the second source S2. As shown in FIG. 8E, a source dielectric layer 140 is formed covering the first source S1, the second source S2, the source silicide regions SSR and the isolation portion 120. Subsequently, a gate dielectric layer 130 is formed surrounding the first channel C1, the second channel C2 and the third channel C3. As shown in FIG. 8F, a high-k dielectric layer 150 and a gate G are formed over the source dielectric layer 140 and surrounding the gate dielectric layer 130.

Figure 8G:
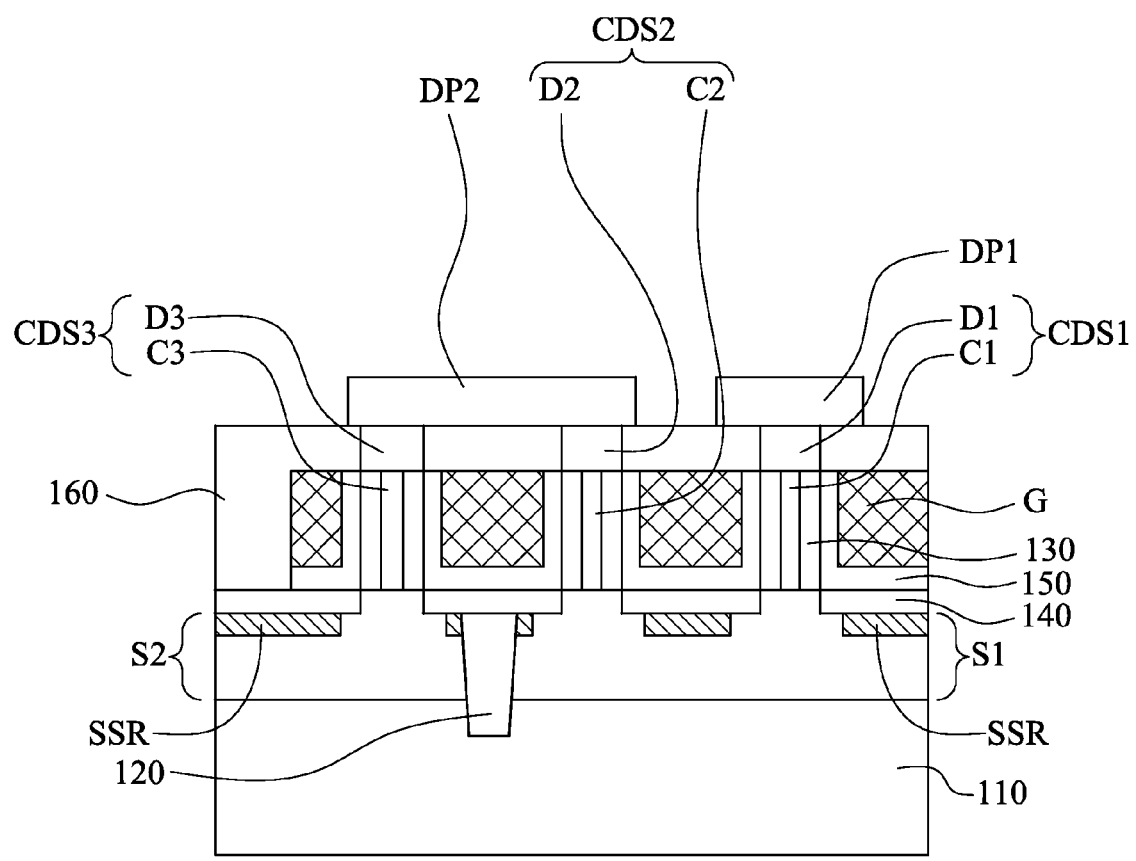

As shown in FIG. 8G, an ILD 160 is formed covering the first channel-drain structure CDS1, the second channel-drain structure CDS2, the third channel-drain structure CDS3 and the gate G, and a planarization process is then performed to expose an upper surface of the first drain D1, an upper surface of the second drain D2 and an upper surface of the third drain D3. Subsequently, a first drain pad DP1 and a second drain pad DP2 are formed. The first drain pad DP1 is formed over and in contact with the first drain D1, and the second drain pad DP2 is formed over and in contact with the second drain D2 and the third drain D3.

After the formation of the first drain pad DP1 and the second drain pad DP2, another ILD 210 is formed over the first drain pad DP1, the second drain pad DP2 and the ILD 160, as shown in FIG. 4. The ILDs 210, 160 are then patterned to form openings, and a conductive material is then filled in the openings to form the conductive plugs P respectively connected to the first drain pad DP1 and the second source S2.

The method of the present disclosure can be used to manufacture the series-connected transistor structure for sharing Vds. Moreover, the series-connected transistor structure manufactured by the method of the present disclosure can occupy a small area compared to a series-connected transistor structure manufactured by a method including forming metal lines and conductive plugs due to process limit of the metal lines and conductive plugs.

According to some embodiments, a series-connected transistor structure includes a first source, a first channel-drain structure, a second channel-drain structure, a gate dielectric layer, a gate, a first drain pad and a second drain pad. The first source is over a substrate. The first channel-drain structure is over the first source and includes a first channel and a first drain over the first channel. The second channel-drain structure is over the first source and substantially parallel to the first channel-drain structure. The second channel-drain structure includes a second channel and a second drain over the second channel. The gate dielectric layer surrounds the first channel and the second channel. The gate surrounds the gate dielectric layer. The first drain pad is over and in contact with the first drain. The second drain pad is over and in contact with the second drain, in which the first drain pad and the second drain pad are separated from each other.

According to some embodiments, a series-connected transistor structure includes a first source, a second source, an isolation portion, a second channel-drain structure, a third channel-drain structure, a gate dielectric layer, a gate and a second drain pad. The first source is over a substrate. The second source is over the substrate and laterally adjacent to the first source. The isolation portion is between the first source and the second source to electrically isolate the first source from the second source. The second channel-drain structure is over the first source and includes a second channel and a second drain over the second channel. The third channel-drain structure is over the second source and substantially parallel to the second channel-drain structure. The third channel-drain structure includes a third channel and a third drain over the third channel. The gate dielectric layer surrounds the second channel and the third channel. The gate surrounds the gate dielectric layer. The second drain pad is over and in contact with the second drain and the third drain.

According to some embodiments, a method of manufacturing a series-connected transistor structure is provided, which includes forming a series-connected source-channel-drain structure protruding over a substrate, the series-connected source-channel-drain structure including a first source over the substrate, a first channel-drain structure over the first source and a second channel-drain structure over the first source, and the first channel-drain structure and the second channel-drain structure substantially parallel to each other, or including the first source, a second source over the substrate and laterally adjacent to the first source, an isolation portion between the first source and the second source, the second channel-drain structure over the first source and a third channel-drain structure over the second source, and the second channel-drain structure and the third channel-drain structure substantially parallel to each other. A source dielectric layer is formed over the first source, or over the first source and the second source. A gate dielectric layer is formed surrounding a channel of the first channel-drain structure and a channel of the second channel-drain structure, or surrounding the channel of the second channel-drain structure and a channel of the third channel-drain structure. A gate is formed over the source dielectric layer and surrounding the gate dielectric layer. A first drain pad and a second drain pad are formed respectively over and in contact with a drain of the first channel-drain structure and a drain of the second channel-drain structure, or the second drain pad is formed over and in contact with the drain of the second channel-drain structure and a drain of the third channel-drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A series-connected transistor structure, comprising:
   a first source over a substrate;
   a first channel-drain structure over the first source, the first channel-drain structure comprising a first channel and a first drain over the first channel;
   a second channel-drain structure over the first source and substantially parallel to the first channel-drain structure, the second channel-drain structure comprising a second channel and a second drain over the second channel;
   a gate dielectric layer surrounding the first channel and the second channel;
   a continuous gate surrounding the gate dielectric layer and between the first channel and the second channel;
   a first drain pad over and in contact with the first drain;
   a second drain pad over and in contact with the second drain, wherein the first drain pad and the second drain pad are separated from each other and the first drain pad is series connected to the second drain pad through the first channel-drain structure, the first source and the second channel-drain structure; and
   two conductive plugs separated from each other and respectively connected to the first drain pad and the second drain pad.

2. The series-connected transistor structure of claim 1, further comprising a source dielectric layer between the first source and the continuous gate.

3. The series-connected transistor structure of claim 2, further comprising a high-k dielectric layer between the gate dielectric layer and the continuous gate and between the source dielectric layer and the continuous gate.

4. The series-connected transistor structure of claim 1, further comprising a source silicide region in the first source.

5. The series-connected transistor structure of claim 4, further comprising a source dielectric layer between the first source and the continuous gate, and the source silicide region is in contact with the source dielectric layer.

6. The series-connected transistor structure of claim 1, wherein at least one of the first drain pad and the second drain pad comprises metal or silicide.

7. The series-connected transistor structure of claim 1, further comprising an inter-layer dielectric (ILD) covering the continuous gate and exposing an upper surface of the first drain and an upper surface of the second drain.

8. The series-connected transistor structure of claim 7, wherein the first drain pad and the second drain pad are over the ILD.

9. The series-connected transistor structure of claim 7, wherein the ILD is between the first drain and the second drain.

10. The series-connected transistor structure of claim 7, further comprising another ILD over and between the first drain pad and the second drain pad.

11. The series-connected transistor structure of claim 10, wherein the two conductive plugs are through the other ILD.

12. The series-connected transistor structure of claim 1, wherein the first drain has a width greater than a width of the first channel.

13. The series-connected transistor structure of claim 1, wherein the second drain has a width greater than a width of the second channel.

14. The series-connected transistor structure of claim 1, wherein the first source has two protruding portions respectively in contact with the first channel and the second channel.

15. The series-connected transistor structure of claim 14, wherein one of the two protruding portions in contact with the first channel has a width greater than a width of the first channel.

16. The series-connected transistor structure of claim 15, wherein the other of the two protruding portions in contact with the second channel has a width greater than a width of the second channel.

17. The series-connected transistor structure of claim 14, further comprising a source dielectric layer between the two protruding portions.

* * * * *